(12) United States Patent
Ogawa et al.

(10) Patent No.: US 10,804,039 B2
(45) Date of Patent: Oct. 13, 2020

(54) METHOD FOR PRODUCING ELECTRODE FOIL AND METHOD FOR MANUFACTURING ELECTROLYTIC CAPACITOR

(71) Applicant: Panasonic Intellectual Property Management Co., Ltd., Osaka (JP)

(72) Inventors: Miwa Ogawa, Osaka (JP); Ayumi Kochi, Hyogo (JP); Yasuhiro Tsuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/106,210

(22) Filed: Aug. 21, 2018

(65) Prior Publication Data

US 2018/0358181 A1    Dec. 13, 2018

Related U.S. Application Data

(63) Continuation of application No. PCT/JP2017/005036, filed on Feb. 13, 2017.

(30) Foreign Application Priority Data

Mar. 10, 2016    (JP) .................. 2016-047191

(51) Int. Cl.
 *C23C 28/00*    (2006.01)
 *C23C 28/04*    (2006.01)
 (Continued)

(52) U.S. Cl.
 CPC ....... *H01G 9/0032* (2013.01); *C23C 16/0227* (2013.01); *C23C 16/0272* (2013.01);
 (Continued)

(58) Field of Classification Search
 CPC ................. C23C 28/04; C23C 28/00
 (Continued)

(56) References Cited

U.S. PATENT DOCUMENTS

2008/0094775 A1* 4/2008 Sneh ............... H01G 4/10
                                                  361/275.3
2016/0322171 A1   11/2016 Saeki et al.
(Continued)

FOREIGN PATENT DOCUMENTS

CN    101088131 A     12/2007
CN    105355433 A  *  2/2016    ........... H01G 9/04
(Continued)

OTHER PUBLICATIONS

International Search Report of PCT application No. PCT/JP2017/005036 dated Apr. 18, 2017.
(Continued)

*Primary Examiner* — Edna Wong
(74) *Attorney, Agent, or Firm* — McDermott Will & Emery LLP

(57) ABSTRACT

An electrolytic capacitor has an electrode foil that includes a metal foil containing a first metal, a first dielectric layer disposed on the metal foil, and a second dielectric layer disposed on the first dielectric layer. A method for manufacturing the electrolytic capacitor includes subjecting a roughening treatment to the metal foil and forming the second dielectric layer on a roughened surface of the metal foil by an atomic layer deposition method. The second dielectric layer contains an oxide of a second metal. The method further includes forming the first dielectric layer containing an oxide of the first metal between the metal foil and the second dielectric layer by subjecting the metal foil to an anodization treatment.

6 Claims, 2 Drawing Sheets

(51) Int. Cl.
　　　*H01G 9/00*　　　(2006.01)
　　　*H01G 9/055*　　(2006.01)
　　　*H01G 9/04*　　　(2006.01)
　　　*H01G 9/042*　　(2006.01)
　　　*C23C 16/02*　　 (2006.01)
　　　*C25D 11/10*　　 (2006.01)
　　　*C23C 16/455*　　(2006.01)
　　　*C23C 16/40*　　 (2006.01)
　　　*C25D 11/16*　　 (2006.01)
　　　*H01G 9/025*　　(2006.01)
　　　*H01G 9/035*　　(2006.01)
　　　*H01G 9/045*　　(2006.01)

(52) U.S. Cl.
　　　CPC ........ *C23C 16/40* (2013.01); *C23C 16/45525* (2013.01); *C25D 11/10* (2013.01); *C25D 11/16* (2013.01); *H01G 9/0036* (2013.01); *H01G 9/025* (2013.01); *H01G 9/035* (2013.01); *H01G 9/04* (2013.01); *H01G 9/042* (2013.01); *H01G 9/045* (2013.01); *H01G 9/055* (2013.01)

(58) Field of Classification Search
　　　USPC .......................... 205/199, 201, 188, 205, 219
　　　See application file for complete search history.

(56) References Cited

U.S. PATENT DOCUMENTS

2016/0329158 A1　　11/2016　Hattori et al.
2017/0256362 A1*　  9/2017　Tsubaki ................ H01G 9/028

FOREIGN PATENT DOCUMENTS

| | | |
|---|---|---|
| JP | 2012-043960 | 3/2012 |
| TW | 200644012 A | 12/2006 |
| WO | 2006/117985 | 11/2006 |
| WO | 2015/118901 | 8/2015 |
| WO | 2015/118902 A1 | 8/2015 |

OTHER PUBLICATIONS

English Translation of Chinese Search Report dated Jul. 24, 2019 for the related Chinese Patent Application No. 201780014517.8.
English Translation of Chinese Search Report dated Feb. 25, 2020 for the related Chinese Patent Application No. 201780014517.8.

* cited by examiner

METHOD FOR PRODUCING ELECTRODE FOIL AND METHOD FOR MANUFACTURING ELECTROLYTIC CAPACITOR

RELATED APPLICATIONS

This application is a continuation of the PCT International Application No. PCT/JP2017/005036 filed on Feb. 13, 2017, which claims the benefit of foreign priority of Japanese patent application No. 2016-047191 filed on Mar. 10, 2016, the contents all of which are incorporated herein by reference.

BACKGROUND

1. Technical Field

The present disclosure relates to a method for producing an electrode foil that contributes to an improvement in voltage resistance and electrostatic capacity of an electrolytic capacitor. The disclosure also relates to a method for manufacturing such an electrolytic capacitor.

2. Description of the Related Art

A metal foil containing a valve metal is used as an anode body for an electrolytic capacitor. Etching is applied to all or part of a main surface of the metal foil so as to increase capacitance of the electrolytic capacitor. After that, in most cases, the metal foil receives an anodization treatment, and a layer of a metallic oxide (a dielectric) is formed on the uneven surface formed by etching.

Unexamined Japanese Patent Publication No. 2012-43960 discloses a technique for forming a dielectric layer on an etched surface of a metal foil by an atomic layer deposition method in place of the anodization treatment.

SUMMARY

An electrode foil includes a metal foil containing a first metal, a first dielectric layer disposed on the metal foil, and a second dielectric layer disposed on the first dielectric layer. A method for producing the electrode foil according to a first aspect of the present disclosure includes subjecting a roughening treatment to the metal foil and forming the second dielectric layer on a roughened surface of the metal foil by an atomic layer deposition method. The second dielectric layer contains an oxide of a second metal. The method further includes forming the first dielectric layer containing an oxide of the first metal between the metal foil and the second dielectric layer by subjecting the metal foil to an anodization treatment.

An electrolytic capacitor has an electrode foil that includes a metal foil containing a first metal, a first dielectric layer disposed on the metal foil, and a second dielectric layer disposed on the first dielectric layer. A method for manufacturing the electrolytic capacitor according to a second aspect of the present disclosure includes subjecting a roughening treatment to the metal foil and forming the second dielectric layer on a roughened surface of the metal foil by an atomic layer deposition method. The second dielectric layer contains an oxide of a second metal. The method further includes preparing the electrode foil by forming the first dielectric layer containing an oxide of the first metal between the metal foil and the second dielectric layer by subjecting the metal foil to an anodization treatment, and at least one of impregnating of the electrode foil with an electrolyte solution and forming of a solid electrolyte layer on a surface of the second dielectric layer.

A method according to the present disclosure provides an electrolytic capacitor that is high in capacity and excellent in voltage resistance.

DETAILED DESCRIPTION OF EMBODIMENT

Figure 1:
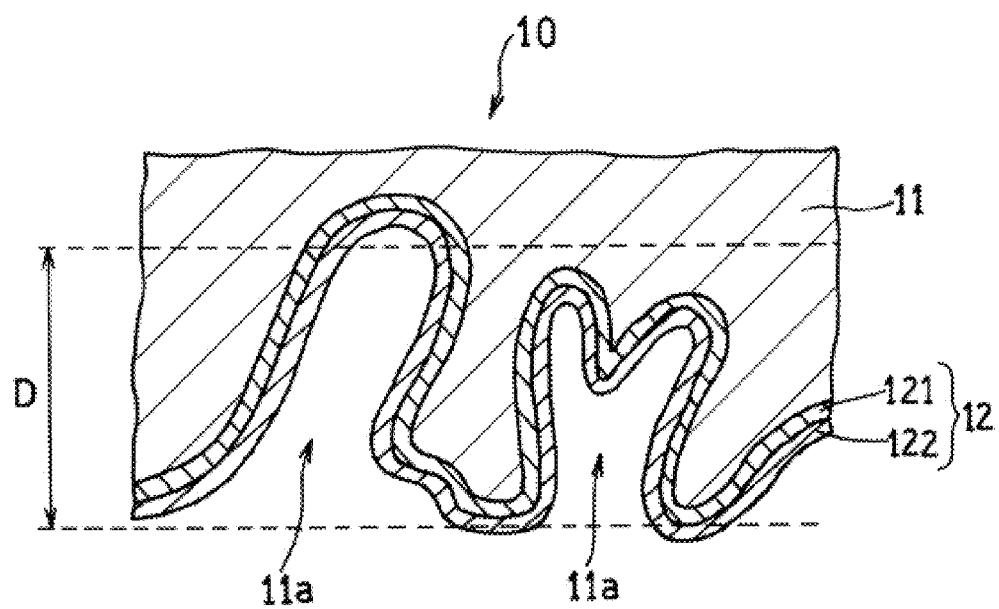
FIG. 1 is an enlarged cross-sectional view illustrating a surface part of an electrode foil produced by a method according to an exemplary embodiment of the present disclosure.

The technology disclosed in Unexamined Japanese Patent Publication No. 2012-43960 does not provide satisfactory improvements in capacitance and voltage resistance for electrolytic capacitors.

An electrode foil provided by a production method according to an exemplary embodiment of the present disclosure includes two dielectric layers that cover surfaces of deep (deepest) portions of pits formed on a roughened surface of metal foil. An electrode foil like this is produced by a method that includes following steps. A metal foil containing a first metal is prepared (a first step). The metal foil is subjected to a roughening treatment (a second step). A second dielectric layer on a roughened surface of the metal foil is formed by an atomic layer deposition method, in which the second dielectric layer contains an oxide of a second metal (a third step). A first dielectric layer containing an oxide of the first metal is formed between the metal foil and the second dielectric layer by subjecting the metal foil, on which the second dielectric layer has been formed, to an anodization treatment (a fourth step). An electrode foil produced by this method contributes to an increase in capacitance of an electrolytic capacitor, a rise in spontaneous potential of a metal foil, and an improvement in voltage resistance. Hereinafter, steps of a method for producing an electrode foil according to the present exemplary embodiment are described.

[Method for Producing Electrode Foil]

(1) Step of Preparing Metal Foil (First Step)

A metal foil containing a first metal is prepared. A type of the first metal is not particularly limited, but it is preferred to use a valve metal such as aluminum (Al), tantalum (Ta), or niobium (Nb), or an alloy including a valve metal, from the viewpoint of facilitating formation of a first dielectric layer. A thickness of the metal foil is not particularly limited, but ranges from 15 μm to 300 μm, inclusive, for example.

(2) Step of Subjecting a Roughening Treatment to Metal Foil (Second Step)

Next, a surface of the metal foil is roughened. By the roughening, a plurality of pits are formed on the surface of the metal foil. The roughening is preferably performed by etching the metal foil. The etching process involves direct current etching by direct electric current or alternating current etching by alternating electric current, for example.

A pore diameter of each of the pits formed on the surface of the metal foil is not particularly limited, but preferably ranges from 50 nm to 2,000 nm, inclusive, from the viewpoint of increasing surface area and facilitating formation of a second dielectric layer deep inside the pits. The pore diameter of the pit is, for example, a model pore diameter determined from a fine pore distribution measured by a mercury porosimeter. A depth of the pit is not particularly limited, but may be specified appropriately in accordance with the thickness of the metal foil. In particular, from the viewpoint of increasing surface area and maintaining electrode foil strength, the depth of the pit (thickness D of an etched region in which pits are formed) preferably ranges from one tenth to four tenths, inclusive, of the thickness of the metal foil that has yet to be etched. Thickness D of the etched region is an average value of thicknesses at 10 arbitrary points on a scanning electron microscopy (SEM) or transmission electron microscopy (TEM) image of a cross section of the metal foil. In a similar manner, thicknesses of the first dielectric layer and the second dielectric layer described below are calculated.

(3) Step of Forming Second Dielectric Layer (Third Step)

A second dielectric layer containing an oxide of a second metal is formed on the roughened surface of the metal foil. The oxide of the second metal is deposited on the surface of the metal foil by atomic layer deposition. A thickness of the second dielectric layer is not particularly limited, but ranges from 0.5 nm to 200 nm, inclusive, for example.

Atomic layer deposition (ALD) is a film deposition method that involves supplying a source gas containing the second metal and an oxidant alternately to a reaction chamber where an object is disposed, and forming a layer containing an oxide of the second metal (the second dielectric layer) on a surface of the object. Since the ALD method causes reactions in a self-limiting manner, the second metal can be deposited on the surface of the object in units of atomic layer. One ALD cycle is made up of supply of the source gas→purge of the source gas→supply of the oxidant→purge of the oxidant. Thus, the thickness of the second dielectric layer can be controlled by regulating a number of the cycles. In other words, the ALD method is a preferred method from the viewpoint of readily controlling the thickness of a formed layer. In contrast to chemical vapor deposition (CVD), which is used under a temperature range of 400° C. to 900° C., the ALD method can be used under a temperature range of 100° C. to 400° C. In other words, the ALD method is preferable from the viewpoint of limiting thermal damage to the metal foil.

The ALD method enables formation of a thin film on a surface of a deep portion of the pit if the pore diameter of the pit is at least about 10 nm, for example. As described above, the pit formed on the surface of the metal foil has a pore diameter of 50 nm or larger in most cases. Accordingly, the ALD method enables formation of the second dielectric layer even on a surface of a deep portion of a pit with a small bore diameter and a large depth, i.e. a pit with a high aspect ratio.

For example, the ALD method enables formation of the second dielectric layer in the etched region such that the ratio of concentration C2 to concentration C1, i.e. C2/C1, ranges from 0.5 to 1.2, wherein concentration C1 is a concentration of the second metal in a surface region from the top surface to 0.5 D of the etched region, and concentration C2 is a concentration of the second metal in a deep region, which is the rest of the etched region. The concentration of the second metal can be calculated by analysis of a cross section of the metal foil including the second dielectric layer, such as elemental mapping using energy dispersive X-ray (EDX) spectroscopy.

Examples of the second metal include Al, Ta, Nb, silicon (Si), titanium (Ti), zirconium (Zr), and hafnium (Hf). The second metal may be any one of these metals or a combination of two or more of the metals. In other words, the second dielectric layer may contain any one of $Al_2O_3$, $Ta_2O_5$, $Nb_2O_5$, $SiO_2$, $TiO_2$, $ZrO_2$, and $HfO_2$ or a combination of two or more of these oxides. If the second dielectric layer contains two or more of the oxides of the second metal, these oxides may be mixed together or may be disposed in respective layers. Preferably, the second metal is different in metal type from the first metal contained in the metal foil. In particular, the second metal oxide preferably has a higher relative dielectric constant than the first metal oxide from the viewpoint of an increase in the capacitance of a resultant electrolytic capacitor. Preferably, the oxides of the second metal are $Ta_2O_5$, $TiO_2$, and $SiO_2$ from the viewpoint of an improvement in voltage resistance of the electrolytic capacitor.

The oxidant may be any oxidant used in conventional ALD methods. Examples of the oxidant include water, oxygen, and ozone. The oxidant may be supplied as plasma made of an oxidant to the reaction chamber.

The second metal is supplied as a gasified precursor containing the second metal to the reaction chamber. The precursor is an organometallic compound containing the second metal. This facilitates chemisorption of the second metal onto the object. The precursor may be any of organometallic compounds used in conventional ALD methods.

Examples of the precursor containing Ti include bis(tert-butylcyclopentadienyl)titanium(IV) dichloride ($C_{18}H_{26}Cl_2Ti$), tetrakis(dimethylamino)titanium(IV) ($[(CH_3)_2N]_4Ti$, TDMAT), tetrakis(dimethylamino)titanium (IV) ($[(C_2H_5)_2N]_4Ti$), tetrakis(ethylmethylamino)titanium (IV) ($Ti[N(C_2H_5)(CH_3)]_4$), titanium(IV) diisopropoxidebis (2,2,6,6-tetramethyl-3,5-heptanedionate) ($Ti[OCC(CH_3)_3CHCOC(CH_3)_3]_2(OC_3H_7)_2$), titanium tetrachloride ($TiCl_4$), titanium(IV) isopropoxide ($Ti[OCH(CH_3)_2]_4$), and titanium(IV) ethoxide ($Ti[O(C_2H_5)]_4$).

Examples of the precursor containing Al include trimethylaluminum (($CH_3)_3Al$)). Examples of the precursor containing Zr include bis(methyl-η5-cyclo-pentadienyl) methoxymethylzirconium ($Zr(CH_3C_5H_4)_2CH_3OCH_3$), tetrakis(dimethylamido)zirconium(IV) ($[(CH_3)_2N]_4Zr$), tetrakis (ethylmethylamido)zirconium(IV) ($Zr(NCH_3C_2H_5)_4$), and zirconium(IV) tert-butoxide ($Zr[OC(CH_3)_3]_4$). Examples of the precursor containing Nb include niobium(V) ethoxide ($Nb(OCH_2CH_3)_5$) and tris(diethylamido)(tert-butylimido) niobium(V) ($C_{16}H_{39}N_4Nb$).

Examples of the precursor containing Si include N-sec-Butyl(trimethylsilyl)amine ($C_7H_{19}NSi$), 1,3-diethyl-1,1,3,3-tetramethyldisilazane ($C_8H_{23}NSi_2$), 2,4,6,8,10-pentamethylcyclopentasiloxane (($CH_3SiHO)_5$), pentamethyldisilane (($CH_3)_3SiSi(CH_3)_2H$), tris(isopropoxy)silanol ($[(H_3C)_2CHO]_3SiOH$), chloropentamethyldisilane (($CH_3)_3SiSi(CH_3)_2Cl$), dichlorosilane ($SiH_2Cl_2$), tris(dimethylamino) silane ($Si[N(CH_3)_2]_4$), tetraethylsilane ($Si(C_2H_5)_4$), tetramethylsilane ($Si(CH_3)_4$), tetraethoxysilane ($Si(OC_2H_5)_4$), dodecamethylcyclohexasilane (($Si(CH_3)_2)_6$), silicon tetrachloride ($SiCl_4$), and silicon tetrabromide ($SiBr_4$).

Examples of the precursor containing Ta include tris (ethylmethylamido)(tert-butylimido)tantalum(V) ($C_{13}H_{33}N_4Ta$), tantalum(V) pentaethoxide ($Ta(OC_2H_5)_5$), tris(diethylamido)(tert-butylimido)tantalum(V) (($CH_3)_3$ $CNTa(N(C_2H_5)_2)_3$), and pentakis(dimethylamino)tantalum (V) ($Ta(N(CH_3)_2)_5$).

Examples of the precursor containing Hf include hafnium tetrachloride ($HfCl_4$), tetrakis(dimethylamino)hafnium (Hf $[N(CH_3)_2]_4$), tetrakis(ethylmethylamino)hafnium (Hf[N $(C_2H_5)(CH_3)]_4$), tetrakis(dimethylamino)hafnium (Hf[N $(C_2H_5)_2]_4$), and hafnium tert-butoxide (Hf[OC($CH_3)_3]_4$).

(4) Step of Forming First Dielectric Layer (Fourth Step)

Subsequently, an anodization of the metal foil on which the second dielectric layer has been formed is conducted. As a result, with reference to FIG. 1 for example, first dielectric layer 121 containing an oxide of the first metal that is a component of metal foil 11 is formed between metal foil 11 and second dielectric layer 122. Since first dielectric layer 121 is formed by the anodization of metal foil 11, the first dielectric layer is formed up to surfaces of deepest portions of pits 11a.

According to the ALD method, thin uniform second dielectric layer 122 can be formed. However, in some cases, the second dielectric layer actually has a defect such as a pinhole on a surface of an interior (especially a deepest portion) of pit 11a. Then, metal foil 11 on which second dielectric layer 122 is formed is subjected to an anodization treatment. This process enables the ionized first meal to diffuse to second dielectric layer 122. The first meal that has diffused to second dielectric layer 122 repairs the defect on second dielectric layer 122. As a consequence, a layer having a uniform thickness without pinhole is formed to constitute entire dielectric layer 12. This results in an increase in the capacitance of the electrolytic capacitor, a rise in spontaneous potential of metal foil 11, and an improvement in voltage resistance. A thickness of first dielectric layer 121 is not particularly limited.

The defect on second dielectric layer 122 is repaired through the anodization treatment. This is proven by the evidence that second dielectric layer 122 contains the first metal as well as the second metal after the anodization treatment. Additionally, it is proven by the evidence that first dielectric layer 121 having being formed becomes thinner. For example, first dielectric layer 121 is thinner in thickness than a first dielectric layer that is formed in metal foil 11 without second dielectric layer 122 after having subjected an anodization under the same conditions. Moreover, the thickness of first dielectric layer 121 decreases with an increase in the thickness of second dielectric layer 122. It is considered that thicker second dielectric layer 122 suppresses the elution of the first metal at the time of an anodization treatment, and an amount of the defect that has to be repaired by the first metal increases in second dielectric layer 122. Consequently, an increase in the capacitance of a resultant electrolytic capacitor is brought by a procedure that involves forming second dielectric layer 122 containing an oxide of the second metal with a higher relative dielectric constant than that of the first metal oxide and then forming first dielectric layer 121 by subjecting an anodization to metal foil 11. This is because the procedure causes a decrease in the thickness of first dielectric layer 121 that contains the first metal with a lower relative dielectric constant.

A method for subjecting metal foil 11 to an anodization is not particularly limited. For example, the method involves immersing metal foil 11 in an anodization solution such as an ammonium adipate solution and applying a voltage to metal foil 11 (anodic oxidization). The thickness of first dielectric layer 121 changes depending on the applied voltage at the time of anodization.

No particular limitation is placed on a ratio between thickness T2 of second dielectric layer 122 and thickness T1 of first dielectric layer 121 which are formed as described above. The ratio can be specified suitably according to factors such as an utilization of the capacitor and a desired effect. The ratio of thicknesses T1/T2 may be approximately 0.01 or not less than 30, for example. In some cases, a combined thickness of second dielectric layer 122 and first dielectric layer 121 can be approximately identical to the thickness of a dielectric layer containing the first metal which is formed in metal foil 11 without second dielectric layer 122 by subjecting an anodization under the same conditions. The first metal and the second metal can be contained as a composite oxide of these substances in second dielectric layer 122. In other words, the third step and the fourth step described above have been taken for metal foil 11 in this order if second dielectric layer 122 contains a composite oxide of the first metal and the second metal.

[Electrolytic Capacitor]

An electrolytic capacitor including electrode foil 10 as an anode body is manufactured, for example, by taking a fifth step that involves impregnating electrode foil 10 produced through the first to the fourth steps described above with an electrolyte solution and/or forming a solid electrolyte layer on a surface of second dielectric layer 122.

(5) Step of Impregnating Electrode Foil with Electrolyte Solution and/or Forming Solid Electrolyte Layer on a Surface of Second Dielectric Layer (Fifth Step)

In the fifth step, electrode foil 10 is impregnated with an electrolyte solution, or a solid electrolyte layer is formed on the surface of second dielectric layer 122 of electrode foil 10. If both a process of impregnating the electrode foil with an electrolyte solution and a process of forming a solid electrolyte layer on the second dielectric layer are performed, the forming of the solid electrolyte layer comes before the impregnating of the electrode foil with the electrolyte solution.

The electrolyte solution with which electrode foil 10 is impregnated may be a nonaqueous solvent or a mixture of a nonaqueous solvent and an ionic substance (a solute such as an organic salt) dissolved in the nonaqueous solvent. The nonaqueous solvent may be an organic solvent or an ionic liquid. Prefereably, the nonaqueous solvent is a high boiling point solvent. Examples of the nonaqueous solvent include polyols such as ethylene glycol and propylene glycol, cyclic sulfones such as sulfolane, lactones such as γ-butyrolactone, amides such as N-methylacetamide, N,N-dimethylformamide, and N-methyl-2-pyrrolidone, esters such as methyl acetate, carbonate compounds such as propylene carbonate, ethers such as 1,4-dioxane, ketones such as methyl ethyl ketone, and formaldehyde. The organic salt is a salt in which at least one of an anion and a cation includes an organic substance. Examples of the organic salt include trimethylamine maleate, triethylamine borodisalicylate, ethyldimethylamine phthalate, mono 1,2,3,4-tetramethylimidazolinium phthalate, and mono 1,3-dimethyl-2-ethylimidazolinium phthalate.

The solid electrolyte layer contains, for example, a manganese compound and a conductive polymer. In other words, an electrolyte that is put into contact with electrode foil 10 contains a manganese compound and a conductive polymer. Examples of the conductive polymer include polypyrrole, polythiophene, polyaniline, and their derivatives. The solid electrolyte layer including a conductive polymer can be formed through, for example, chemical polymerization and/ or electrolytic polymerization of a raw material monomer on second dielectric layer 122. Alternatively, the solid electrolyte layer including a conductive polymer can be formed by coating second dielectric layer 122 with a solution in which the conductive polymer is dissolved or a dispersion liquid in which the conductive polymer is dispersed.

Figure 2:
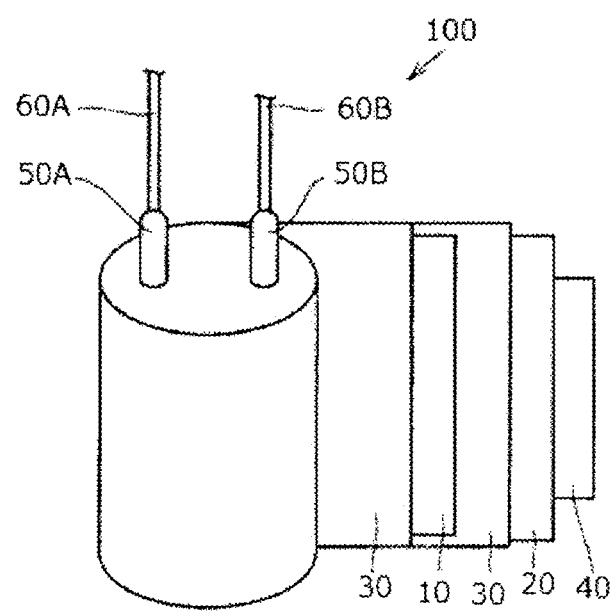
FIG. 2 is an exploded view illustrating main components of an electrolytic capacitor manufactured by a method according to an exemplary embodiment of the present disclosure.

The fifth step may be taken after making of wound body 100 as shown in FIG. 2. FIG. 2 is an exploded view illustrating a configuration of wound body 100.

The making of wound body 100 requires preparing cathode body 20. A metal foil can also be used for cathode body 20 as with electrode foil 10 (the anode body). A type of the metal is not particularly limited, but it is preferred to use a valve metal such as Al, Ta, or Nb, or an alloy including a valve metal. A surface of cathode body 20 may be roughened as necessary. The surface of cathode body 20 may be provided with an anodization coating film, a coating film of a metal (a dissimilar metal) different from the metal contained in cathode body 20, or a coating film of a nonmetal. The dissimilar metal may be a metal such as Ti, and the nonmetal may be a nonmetal such as carbon.

Next, electrode foil 10 and cathode body 20 are wound with separator 30 disposed between the electrode foil and the cathode body. In the meantime, one ends of lead tabs 50A and 50B are connected to the respective electrodes. The electrodes are wound so as to coil around lead tabs 50A and 50B. Lead wires 60A and 60B are connected to the other ends of lead tabs 50A and 50B, respectively. A material for lead wires 60A and 60B is not particularly limited as long as the material is a conductive material.

A material for separator 30 is not particularly limited. Examples of the material include nonwoven fabrics that are primarily composed of, for example, cellulose, polyethylene terephthalate, vinylon, or an aramid fiber. A material for lead tabs 50A and 50B is not particularly limited as long as the material is a conductive material. Surfaces of lead tabs 50A and 50B may be subjected to an anodization treatment. Further, lead tabs 50A and 50B may be covered with a resin material at a part in contact with sealing member 212 (see FIG. 3) and a part connected to lead wire 60A or 60B.

Next, fastening tape 40 is disposed on an outer surface of cathode body 20 positioned at an outermost layer of wound electrode foil 10, cathode body 20, and separator 30, to fix an end of cathode body 20 with fastening tape 40. If electrode foil 10 is prepared by cutting large metal foil 11, resultant wound body 100 may further be subjected to an anodization treatment in order to provide a dielectric layer on a cut surface of electrode foil 10.

A method of putting an electrolyte into contact with wound body 100 is not particularly limited. The method may involve immersing wound body 100 in an electrolyte contained in a container or adding an electrolyte dropwise to wound body 100, for example. Impregnation may be performed under a reduced pressure, in an atmosphere ranging, for example, from 10 kPa to 100 kPa, preferably from 40 kPa to 100 kPa.

Figure 3:
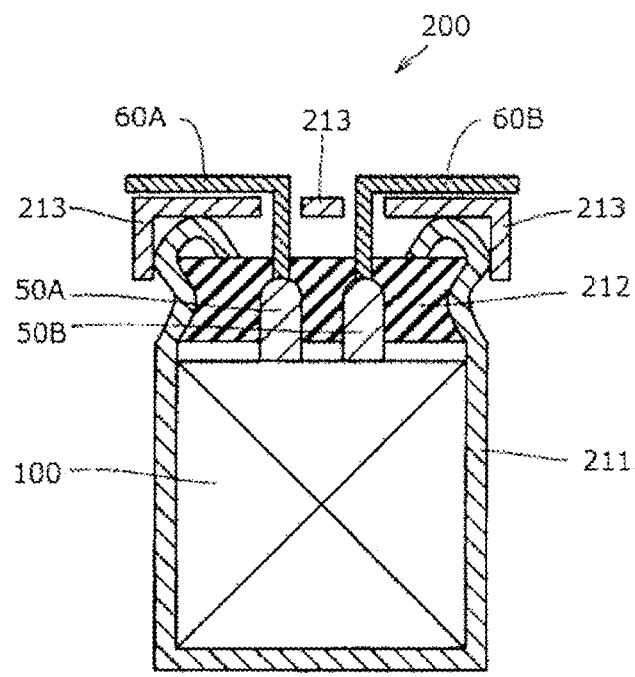
FIG. 3 is a schematic cross-sectional view illustrating an electrolytic capacitor manufactured by a method according to an exemplary embodiment of the present disclosure.

Next, wound body 100 is sealed, so that electrolytic capacitor 200 shown in FIG. 3 is obtained. FIG. 3 is a schematic cross-sectional view of electrolytic capacitor 200 obtained by a manufacturing method according to the present exemplary embodiment. Electrolytic capacitor 200 is manufactured, for example, as described below. First, wound body 100 is housed in bottomed case 211 so that lead wires 60A, 60B are positioned at an open upper surface of bottomed case 211. Examples of a material for bottomed case 211 include metals such as aluminum, stainless steel, copper, iron and brass, and alloys of these metals.

Next, sealing member 212 formed so as to allow lead wires 60A, 60B to penetrate the sealing member is disposed above wound body 100 to encapsulate wound body 100 in bottomed case 211. Sealing member 212 is satisfactory as long as the sealing member is an insulating substance. As the insulating substance, an elastic body is preferable, and, for example, high heat resistance silicone rubber, fluororubber, ethylene propylene rubber, Hypalon™ rubber, butyl rubber or isoprene rubber is especially preferable.

Next, bottomed case 211 is, at a part near an opening end, processed by transverse drawing, and is, at the opening end, curled to swage sealing member 212. Lastly, base plate 213 is disposed on a curled part of the bottomed case to complete sealing. Then, an aging treatment may be performed while a rated voltage is applied.

In the exemplary embodiment described above, a wound electrolytic capacitor has been described. An application range of the present disclosure, however, is not limited to the wound electrolytic capacitor, and the present disclosure can also be applied to other electrolytic capacitors such as laminated electrolytic capacitors.

Hereinafter, the present disclosure is described in more detail with reference to examples. The present disclosure, however, is not to be considered to be limited to the examples.

EXAMPLE 1

In the present example, a wound electrolytic capacitor (Φ(diameter): 6.3 mm×L (length): 9.9 mm) having a rated voltage of 2.0 V was produced. Hereinafter, a specific method for manufacturing the electrolytic capacitor is described.

(Production of Electrode Foil)

An aluminum foil with a thickness of 120 μm was prepared. The aluminum foil was subjected to direct current etching to roughen a surface of the aluminum foil. An etched region with a thickness of 40 μm was formed on the aluminum foil surface. Pits on the surface each had a pore diameter ranging from 100 nm to 200 nm.

Next, a second dielectric layer was formed on the surface of the aluminum foil by an ALD method (temperature: 200° C.; precursor: TDMAT; oxidant: $H_2O$; pressure: 10 Pa; and 60 cycles). Subsequently, the aluminum foil was subjected to an anodization treatment, so that a first dielectric layer was formed and an electrode foil was obtained. The anodization treatment was performed by immersing the aluminum foil in an ammonium adipate solution and applying a voltage of 4 V to the aluminum foil. Then, the electrode foil was cut to prepare an anode body.

An elemental analysis of the dielectric layer was performed by using EDX spectroscopy. The second dielectric layer (thickness: 2.5 nm) contained $TiO_2$ and a composite oxide of Ti and Al, whereas the first dielectric layer (thickness: 11 nm) contained $Al_2O_3$. The ratio of concentration C2 to concentration C1 (C2/C1) with respect to Ti was 1.0.

(Preparation of Cathode Body)

A 50-μm-thick aluminum foil was subjected to etching to roughen a surface of the aluminum foil. Then, the aluminum foil was cut to prepare a cathode body.

(Production of Wound Body)

An anode lead tab and a cathode lead tab were connected to the anode body and the cathode body, respectively. Then, the anode body and the cathode body were wound with a separator interposed between the anode body and the cathode body while the lead tabs were rolled in the anode body, the cathode body, and the separator. Ends of the lead tabs protruding from a wound body were connected to an anode lead wire and a cathode lead wire, respectively. Then, the produced wound body was subjected to an anodization treatment again to form a dielectric layer at a cutting end of the anode body. Next, an end of an outer surface of the wound body was fixed with a fastening tape.
(Preparation of Conductive Polymer Dispersion Liquid)

A mixed solution was prepared by dissolving 3,4-ethylenedioxythiophene and a dopant, i.e., polystyrenesulfonic acid in ion-exchanged water. While the resultant mixed solution was stirred, iron (III) sulfate (oxidant) that had been dissolved in ion-exchanged water was added to the mixed solution to cause a polymerization reaction. After the reaction, a resultant reaction solution was dialyzed to remove unreacted monomers and an excessive oxidant, so that a conductive polymer dispersion liquid was obtained that contained about 5% by mass of polyethylene dioxythiophene doped with polystyrenesulfonic acid.
(Formation of Solid Electrolyte Layer)

The wound body was immersed in the conductive polymer dispersion liquid housed in a predetermined container in a reduced-pressure atmosphere (40 kPa) for 5 minutes, and then the wound body was picked up from the conductive polymer dispersion liquid. Next, the wound body that had been impregnated with the conductive polymer dispersion liquid was dried in a drying furnace at 150° C. for 20 minutes to form a solid electrolyte layer including the conductive polymer between the anode body and the cathode body.
(Encapsulation of Wound Body)

The wound body having the solid electrolyte layer was encapsulated to complete an electrolytic capacitor shown in FIG. 3. Then, an aging treatment was performed at 130° C. for 2 hours while a rated voltage was applied.

Figure 4:
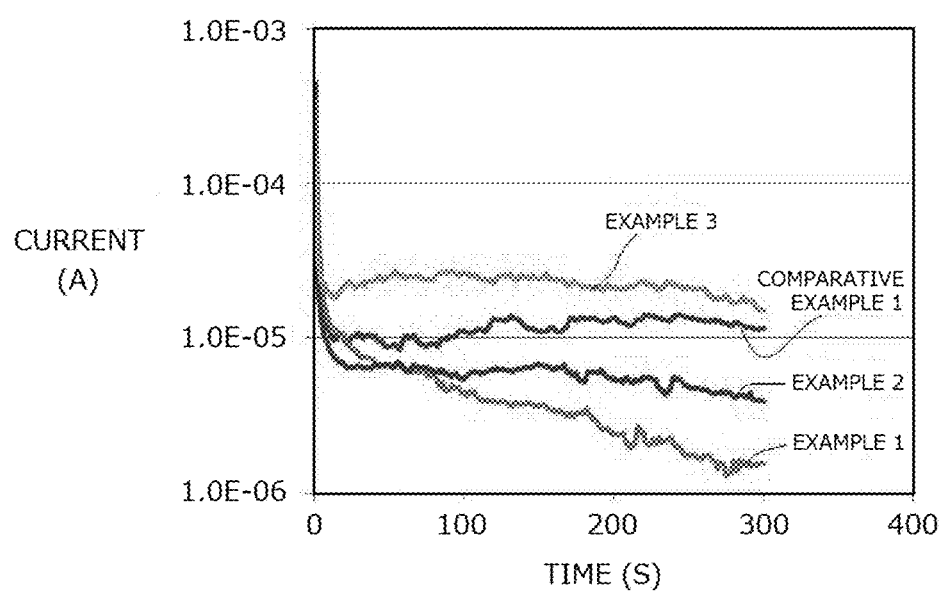
FIG. 4 is a graph showing leakage currents evaluated in examples and a comparative example.

Electrostatic capacity and leakage current were measured for the resultant electrolytic capacitor. A withstand voltage was also measured for the electrolytic capacitor by applying a voltage at an increasing rate of 1.0 V/s until an excess current of 0.5 A flowed. Table 1 shows results of electrostatic capacity and withstand voltage evaluations. FIG. 4 shows results of leakage current measurements. Table 1 also shows relative values when corresponding results of Comparative Example 1 are set to 100.

EXAMPLE 2

An electrolytic capacitor was manufactured and evaluated in the same manner as in Example 1 except for the number of ALD process cycles being set to 100. Table 1 and FIG. 4 show results. After receiving an anodization treatment, the second dielectric layer (thickness: about 4.4 nm) contained $TiO_2$ and a composite oxide of Ti and Al, and the first dielectric layer (thickness: about 8.7 nm) contained $Al_2O_3$. The ratio of concentration C2 to concentration C1 (C2/C1) with respect to Ti was 1.0.

EXAMPLE 3

An electrolytic capacitor was manufactured in the same manner as in Example 1 except for the number of ALD process cycles being set to 180, and the electrolytic capacitor was evaluated. Table 1 and FIG. 4 show results.

After receiving an anodization treatment, the second dielectric layer (thickness: about 7.0 nm) contained $TiO_2$ and a composite oxide of Ti and Al, and the first dielectric layer (thickness: about 7.1 nm) contained $Al_2O_3$. The ratio of concentration C2 to concentration C1 (C2/C1) with respect to Ti was 1.0.

COMPARATIVE EXAMPLE 1

An electrolytic capacitor was manufactured in the same manner as in Example 1 except for no second dielectric layer being formed (only an anodization treatment being performed), and the electrolytic capacitor was evaluated. In a surface of the aluminum foil of the anode body, a layer containing $Al_2O_3$ and having a thickness of about 14 nm was formed. Table 1 and FIG. 4 show results.

COMPARATIVE EXAMPLE 2

An electrolytic capacitor was manufactured in the same manner as in Example 1 except for no first dielectric layer being formed (no anodization treatment being performed). In a surface of the aluminum foil of the anode body, a layer containing $TiO_2$ and having a thickness of about 2.5 nm was formed. However, no measurement of electrostatic capacity was allowed due to a high leakage current. No stable measurement of withstand voltage was allowed.

COMPARATIVE EXAMPLE 3

An electrolytic capacitor was manufactured in the same manner as in Example 1 except for a CVD method being used in place of the ALD method, and the electrolytic capacitor was evaluated for electrostatic capacity and withstand voltage. Table 1 shows results. Although the second dielectric layer contained $TiO_2$ and a composite oxide of Ti and Al, no second dielectric layer was formed on surfaces of deep portions of the pits. As a result, the ratio of concentration C2 to concentration C1 (C2/C1) with respect to Ti was 0.2. The formed second dielectric layer, after receiving an anodization treatment, had a thickness of about 2.5 nm. The first dielectric layer (thickness: about 12 nm) contained $Al_2O_3$.

TABLE 1

| | Capacitance ($\mu F/cm^2$) | Relative Capacitance | Withstand Voltage (V) | Relative Withstand Voltage |
|---|---|---|---|---|
| Example 1 | 38 | 108 | 6.13 | 103 |
| Example 2 | 43 | 123 | 6.21 | 104 |
| Example 3 | 51 | 145 | 6.34 | 106 |
| Comparative Example 1 | 35 | 100 | 5.98 | 100 |
| Comparative Example 2 | — | — | — | — |
| Comparative Example 3 | 33.6 | 96 | 5.82 | 97 |

Examples 1 to 3 showed improvements both in voltage resistance and capacitance compared to Comparative Example 1. No substantial variation was observed between Examples 1 to 3 and Comparative Example 1 in leakage current. Consequently, it is presumed that differences in thickness of the second dielectric layer had virtually no impact on leakage current.

An electrode foil produced by a method according to the present disclosure provides an improvement in capacitance and voltage resistance, and thus can be used in capacitors for various purposes.

What is claimed is:

1. A method for producing an electrode foil that includes a metal foil containing a first metal, a first dielectric layer disposed on the metal foil, and a second dielectric layer disposed on the first dielectric layer, the method comprising:

subjecting a roughening treatment to the metal foil by etching the metal foil to form an etched region in the metal foil;

forming the second dielectric layer on the etched region in the metal foil by an atomic layer deposition method, the second dielectric layer containing an oxide of a second metal; and forming, after the forming of the second dielectric layer, the first dielectric layer containing an oxide of the first metal between the metal foil and the second dielectric layer by subjecting the metal foil to an anodization treatment, wherein in the atomic layer deposition method, the second dielectric layer is formed so that a ratio of concentration C2 to concentration C1 (C2/C1) ranges from 0.5 to 1.2, inclusive, the concentration C1 being a concentration of the second metal in a surface region which is a region having a depth of 0.5 times a depth of the etched region from a top surface of the etched region, the concentration C2 being a concentration of the second metal in a deep region which is a rest of the etched region other than the surface region.

2. The method for producing the electrode foil according to claim 1, wherein the second dielectric layer contains a composite oxide of the first metal and the second metal.

3. The method for producing the electrode foil according to claim 2, wherein the composite oxide is formed in the forming of the first dielectric layer.

4. The method for producing the electrode foil according to claim 1, wherein the first metal is aluminum and the second metal is titanium.

5. The method for producing the electrode foil according to claim 1, wherein in the subjecting of the roughening treatment to the metal foil, the roughening treatment is executed by any one of direct current etching and alternating current etching.

6. A method for manufacturing an electrolytic capacitor having an electrode foil, the electrode foil including a metal foil containing a first metal, a first dielectric layer disposed on the metal foil, and a second dielectric layer disposed on the first dielectric layer, the method comprising:

subjecting a roughening treatment to the metal foil by etching the metal foil to form an etched region in the metal foil;

forming the second dielectric layer on the etched region in the metal foil by an atomic layer deposition method, the second dielectric layer containing an oxide of a second metal;

preparing the electrode foil by forming, after the forming of the second dielectric layer, the first dielectric layer containing an oxide of the first metal between the metal foil and the second dielectric layer by subjecting the metal foil to an anodization treatment; and at least one of impregnating of the electrode foil with an electrolyte solution and forming of a solid electrolyte layer on a surface of the second dielectric layer, wherein in the atomic layer deposition method, the second dielectric layer is formed so that a ratio of concentration C2 to concentration C1 (C2/C1) ranges from 0.5 to 1.2, inclusive, the concentration C1 being a concentration of the second metal in a surface region which is a region having a depth of 0.5 times a depth of the etched region from a top surface of the etched region, the concentration C2 being a concentration of the second metal in a deep region which is a rest of the etched region other than the surface region.

* * * * *